(12) United States Patent
Jeng

(10) Patent No.: US 6,404,280 B1
(45) Date of Patent: Jun. 11, 2002

(54) METHOD AND SYSTEM FOR LOW-DISTORTION POWER AMPLIFICATION

(75) Inventor: Ming-Fure Jeng, Chiayi Hsien (TW)

(73) Assignee: Constel Signal Processing Co., Ltd., Chiayi Hsien (TW)

( * ) Notice: Subject to any disclaimer, the term of this patent is extended or adjusted under 35 U.S.C. 154(b) by 0 days.

(21) Appl. No.: 09/870,693

(22) Filed: Jun. 1, 2001

(51) Int. Cl.⁷ .............................................. H03F 3/38

(52) U.S. Cl. ...................... 330/10; 330/207 A; 375/238
(58) Field of Search .............................. 330/10, 207 A; 375/238

(56) References Cited

U.S. PATENT DOCUMENTS 6,288,605 B1 * 9/2001 Batti et al. ..................... 330/10
6,346,852 B1 * 2/2002 Majni et al. ................... 330/10

FOREIGN PATENT DOCUMENTS

WO 98/44626 10/1998

\* cited by examiner

Primary Examiner—Michael B Shingleton
(74) Attorney, Agent, or Firm—Foley & Lardner

(57) ABSTRACT

In a method and system for low-distortion power amplification, an error signal is generated by comparing a feedback signal obtained from an amplified output signal of a power switching stage with one of an input pulse-width modulated (PWM) signal from a PWM signal generator and a corrected PWM signal at an input terminal of the power switching stage. Each pulse of the input PWM signal is then corrected to result in the corrected PWM signal that is provided to the power switching stage. Each pulse of the input PWM signal is corrected by adjusting the phase thereof such that each pulse of the input PWM signal has a center that forms a predetermined time difference with a center of a corresponding pulse of the corrected PWM signal, and by adjusting the width thereof according to the error signal.

7 Claims, 13 Drawing Sheets

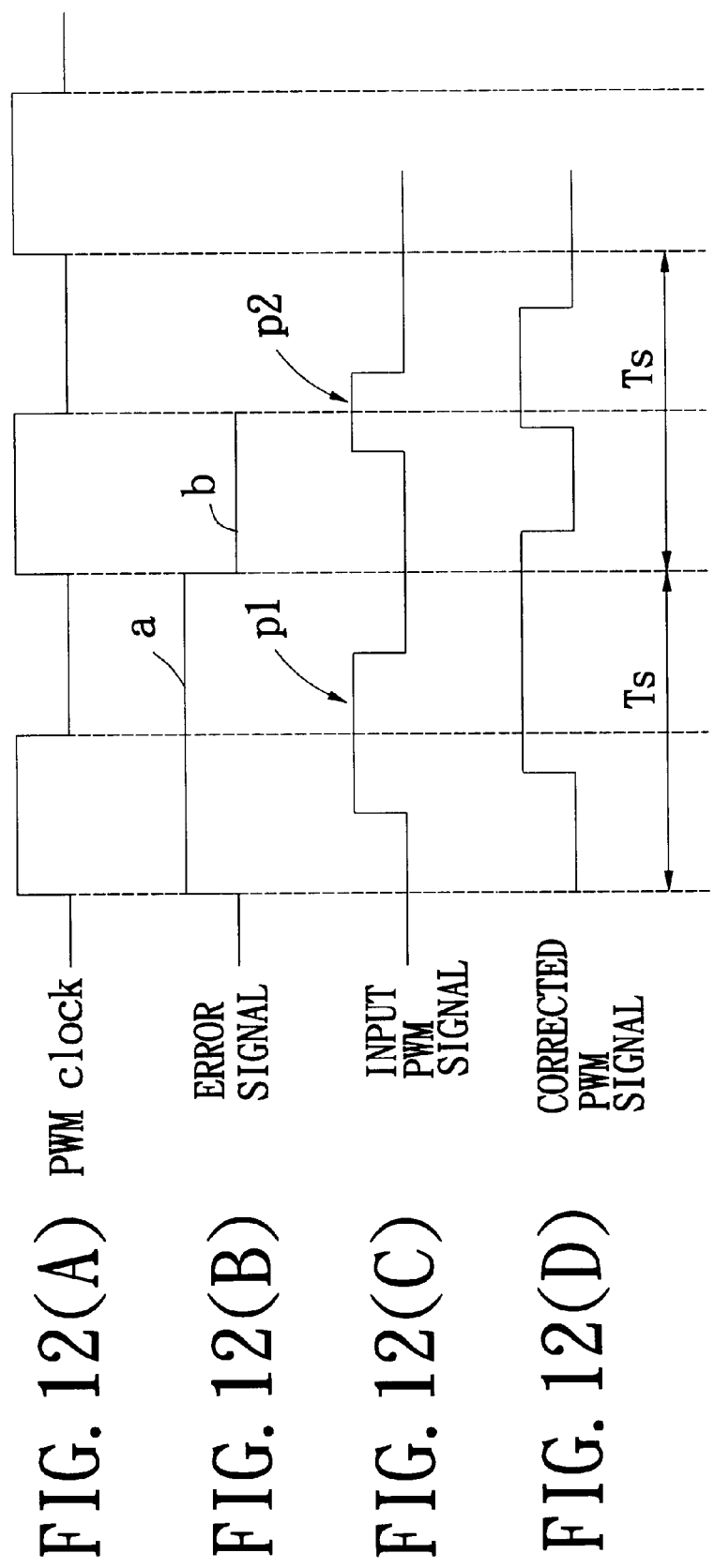

METHOD AND SYSTEM FOR LOW-DISTORTION POWER AMPLIFICATION

BACKGROUND OF THE INVENTION

1. Field of the Invention

The invention relates to a method and system for power amplification, more particularly to a method and system for low-distortion power amplification in which the effects of both phase noise due to non-symmetrical phase shift and internal system noise can be effectively minimized.

2. Description of the Related Art

In a conventional digital power amplifier, an input signal is amplified with the use of a power switching circuit. Two types of power switching circuits are available in the art, namely the half-bridge switching circuit and the H-bridge switching circuit. Transistors are commonly used as switching elements for accomplishing the switching operation. Assuming that transistors are ideal elements, when a pulse-width modulated (PWM) input signal of the digital power amplifier undergoes switching by the switching elements of the power switching circuit, the PWM input signal should actually be amplified. High-frequency components are then eliminated with the use of a low-pass filter such that a complete low-frequency amplified signal can be obtained from an output end of the digital power amplifier. However, the complete signal as such is unlikely to be realized by an actual circuit due to the generation of different types of noise in the digital power amplifier. For example, the power supply of the digital power amplifier will normally generate ripples. In addition, the transistors that serve as the switching elements are non-ideal elements, and when the switching elements switch alternately between ON and OFF states during signal amplification, the ON and OFF switching cycles will generally not match completely. Furthermore, the load characteristics also introduce noise into the digital power amplifier. There is thus severe distortion in the amplified output signal of the digital power amplifier.

A pulse edge delay technique has been proposed heretofore to eliminate the noise introduced by the aforesaid factors. In PCT International Publication Number WO 98/44626, there is disclosed a digital power amplifier that includes a correction unit, a power switching unit and an error processing unit. The correction unit is coupled to the power switching unit and the error processing unit. The correction unit receives a pulse-modulated input and, according to an error signal from the error processing unit, delays the edges of pulses of the pulse-modulated input. After corresponding adjustment of the pulse width, the correction unit provides a corrected pulse-modulated signal to the power switching unit. The power switching unit amplifies the corrected pulse-modulated signal to generate an output signal. The output signal is fed back to the error processing unit, which compares the output signal with the pulse-modulated input to result in a new error signal that is sent to the correction unit for adjusting the pulse width of a succeeding pulse of the pulse-modulated input.

In the pulse edge delay method employed in the aforesaid publication, the width of each pulse of the pulse-modulated input is adjusted according to the error signal so as to eliminate the effect of internal system noise in the digital power amplifier. However, a phase noise is generated in the pulse edge delay method of the aforesaid publication. The phase noise is actually harmonic noise that is introduced due to the non-constant time difference formed between the center of each pulse of the pulse-modulated input and the center of the corresponding pulse of the corrected pulse-modulated signal.

SUMMARY OF THE INVENTION

Therefore, the main object of the present invention is to provide a method and system for low-distortion power amplification in which the effects of both phase noise and internal system noise can be effectively minimized so that a low-distortion amplified signal output can be obtained.

According to one aspect of the invention, a method for low-distortion power amplification comprises the steps of:

generating an error signal by comparing a feedback signal obtained from an amplified output signal at an output terminal of a power switching stage with one of an input pulse-width modulated signal from a pulse-width modulation signal generator and a corrected pulse-width modulated signal at an input terminal of the power switching stage; and correcting each pulse of the input pulse-width modulated signal from the pulse-width modulation signal generator to result in the corrected pulse-width modulated signal that is provided to the input terminal of the power switching stage, said each pulse of the input pulse-width modulated signal being corrected by adjusting the phase thereof such that said each pulse of the input pulse-width modulated signal has a center that forms a predetermined time difference with a center of a corresponding pulse of the corrected pulse-width modulated signal, and by adjusting the width thereof according to the error signal.

According to another aspect of the invention, a system for low-distortion power amplification comprises a pulse-width modulation signal generator, a power switching stage, an error signal generator, and a correction device.

The pulse-width modulation signal generator generates an input pulse-width modulated signal.

The power switching stage has an input terminal to receive a corrected pulse-width modulated signal, and an output terminal from which an amplified output signal is obtained.

The error signal generator includes a feedback signal generator, a comparator, and a processing unit. The feedback signal generator is connected to the output terminal of the power switching stage and is operable so as to generate a feedback signal from the amplified output signal at the output terminal of the power switching stage. The comparator is connected to the feedback signal generator and one of the pulse-width modulation signal generator and the input terminal of the power switching stage. The comparator compares the feedback signal with one of the input pulse-width modulated signal and the corrected pulse-width modulated signal to result in a difference signal. The processing unit is connected to the comparator for processing the difference signal to remove high frequency components therefrom so as to result in an error signal.

The correction device is connected to the pulse-width modulation signal generator, the processing unit and the input terminal of the power switching stage. The correction device corrects each pulse of the input pulse-width modulated signal from the pulse-width modulation signal generator to result in the corrected pulse-width modulated signal that is provided to the input terminal of the power switching stage. The correction device corrects said each pulse of the input pulse-width modulated signal by adjusting the phase thereof such that said each pulse of the input pulse-width modulated signal has a center that forms a predetermined time difference with a center of a corresponding pulse of the corrected pulse-width modulated signal, and by adjusting the width thereof according to the error signal from the processing unit.

BRIEF DESCRIPTION OF THE DRAWINGS

Other features and advantages of the present invention will become apparent in the following detailed description of the preferred embodiments with reference to the accompanying drawings, of which:

FIGS. 12(A) to 12(D) are timing diagrams which illustrate possible incorrect operation of the power amplification system when an error signal is synchronized with a clock of a pulse-width modulation signal generator.

DETAILED DESCRIPTION OF THE PREFERRED EMBODIMENTS

Figure 1:
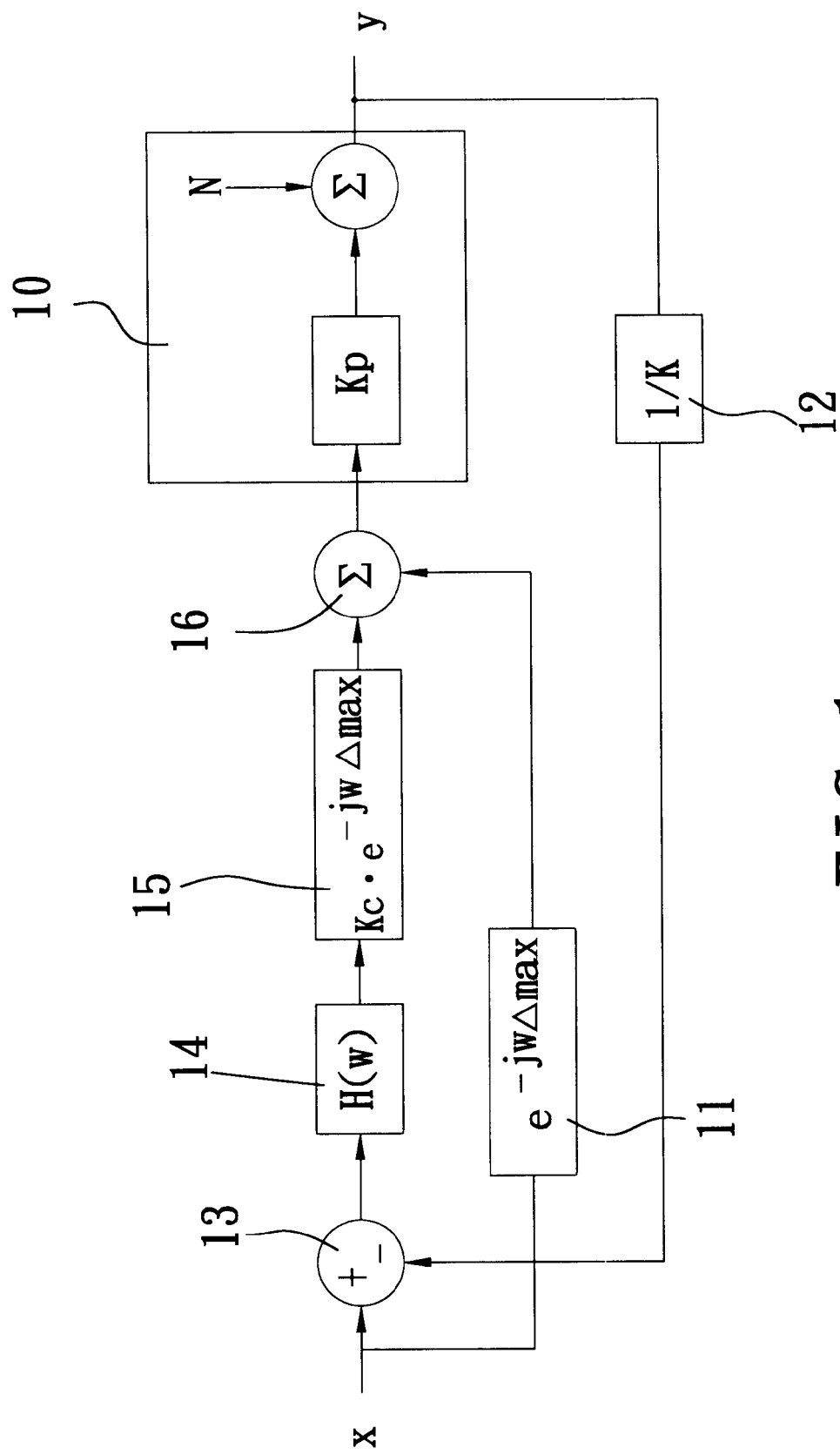
FIG. 1 illustrates a low-frequency model of the first preferred embodiment of a low-distortion power amplification system according to the present invention.

Before the present invention is described in greater detail, it should be noted that like elements are denoted by the same reference numerals throughout the disclosure.

In the low-distortion power amplification method of the present invention, in order to eliminate the phase noise encountered in the aforesaid conventional phase edge delay technique, both the phase and width of each pulse of an input pulse-width modulated signal from a pulse-width modulation signal generator are adjusted. Particularly, the phase of each pulse of the input pulse-width modulated signal is adjusted such that the center of each pulse of the input pulse-width modulated signal forms a predetermined time difference with the center of a corresponding pulse of a corrected pulse-width modulated signal that is supplied to a power switching stage of a power amplification system. In addition, the width of each pulse of the input pulse-width modulated signal is further adjusted in accordance with an error signal that is obtained by comparing an amplified output signal from the power switching stage of the power amplification system with one of the input pulse-width modulated signal and the corrected pulse-width modulated signal. As such, a low-distortion amplified output signal can be obtained after amplification by the power switching stage of the power amplification system according to this invention.

FIG. 1 illustrates a low-frequency model of the first preferred embodiment of a low-distortion power amplification system according to the present invention. As shown, the power amplification system has a terminal from which a low-frequency component (x) of an input pulse-width modulated signal is received, and a power switching stage 10 with an output terminal from which an amplified output signal (y) is obtained. The power switching stage 10 has an amplifier gain (Kp). In the model of FIG. 1, the power switching stage 10 introduces a noise signal (N) therein. In actual practice, the noise signal (N) includes two noise components. A first one of the noise components is attributed to factors, such as non-linear and non-ideal behavior of the power switching stage 10, the load characteristics, and ripples generated by the power supply source. A second one of the noise components is attributed to other factors, such as mismatching, jitters of the input pulse-width modulated signal, and non-ideal behavior of internal elements of the other components of the power amplification system, and is amplified by the power switching stage 10.

In the model of FIG. 1, a feedback signal generator in the form of a scale-down unit 12, a comparator 13, and a processing unit 14 cooperate to form an error signal generator. The scale-down unit 12 is connected to the output terminal of the power switching stage 10, and is used to scale-down the amplified output signal (y) by a predetermined scale-down factor (K) to result in a feedback signal. The comparator 13 receives the low-frequency component (x) and the feedback signal from the scale-down unit 12, and obtains a difference signal there between.

Because the feedback signal is a signal obtained after amplification by the power switching stage 10, it includes complex noise components. Furthermore, because the difference signal is the difference between the low-frequency component (x) and the feedback signal, it contains wideband analog noise signals. There is thus a need to process the difference signal with the use of the processing unit 14 having a total transfer function H(w) so as to remove high-frequency components therefrom.

Figure 2:
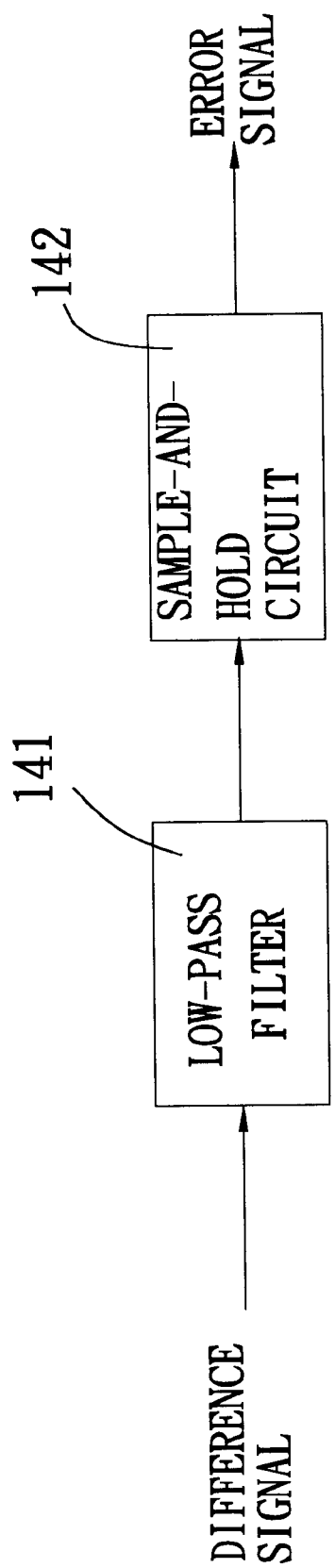
FIG. 2 illustrates a preferred implementation of a processing unit of the model shown in FIG. 1.

Referring to FIG. 2, in one preferred implementation of the processing unit 14, a low-pass filter 141 receives the difference signal from the comparator 13. The filtered output of the low-pass filter 141 is then received by a sample-and-hold circuit 142. In this way, a low-frequency error signal can be obtained from the processing unit 14.

In order for the power amplification system to be suitable for use in the amplification of low-frequency signals, the cut-off frequency of the low-pass filter 141 must be lowered accordingly. For audio signals, the cut-off frequency is about 22 kHz. As such, high frequency signals can be eliminated, whereas only low frequency signals will remain. If the bandwidth of the low-pass filter 141 is relatively wide, the sampling frequency of the sample-and-hold circuit 142 must be relatively high in order to prevent the occurrence of aliasing. However, the low-pass filter 141 with a relatively low cut-off frequency generally has a complicated and expensive design.

Figure 3:
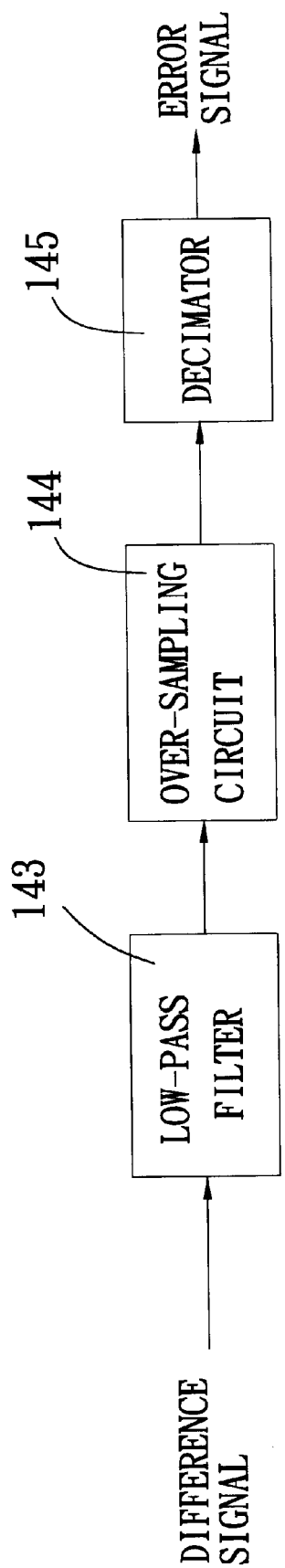
FIG. 3 illustrates another preferred implementation of the processing unit of the model shown in FIG. 1.

FIG. 3 illustrates another preferred implementation of the processing unit 14. As shown, the low-pass filter 141 and the sample-and-hold circuit 142 of the processing unit 14 of FIG. 2 are replaced by an equivalent circuit formed from a string of a low-pass filter 143 with a higher cut-off frequency, an over-sampling circuit 144, and a decimator 145. The low-pass filter 143 removes a portion of the high frequency components from the difference signal. The over-sampling circuit 144, which preferably has a discrete signal processing capability, samples the filtered output of the low-pass filter 143 with an over-sampling rate (M), where (M) is a positive integer. The output of the over-sampling circuit 144 is further sampled by the decimator 145 such that only one sample is outputted to serve as the error signal for every (M) number of samples from the over-sampling circuit 144. Thus, the low-frequency error signal can be obtained from the decimator 145.

Figures 4A, 4B, 4C:
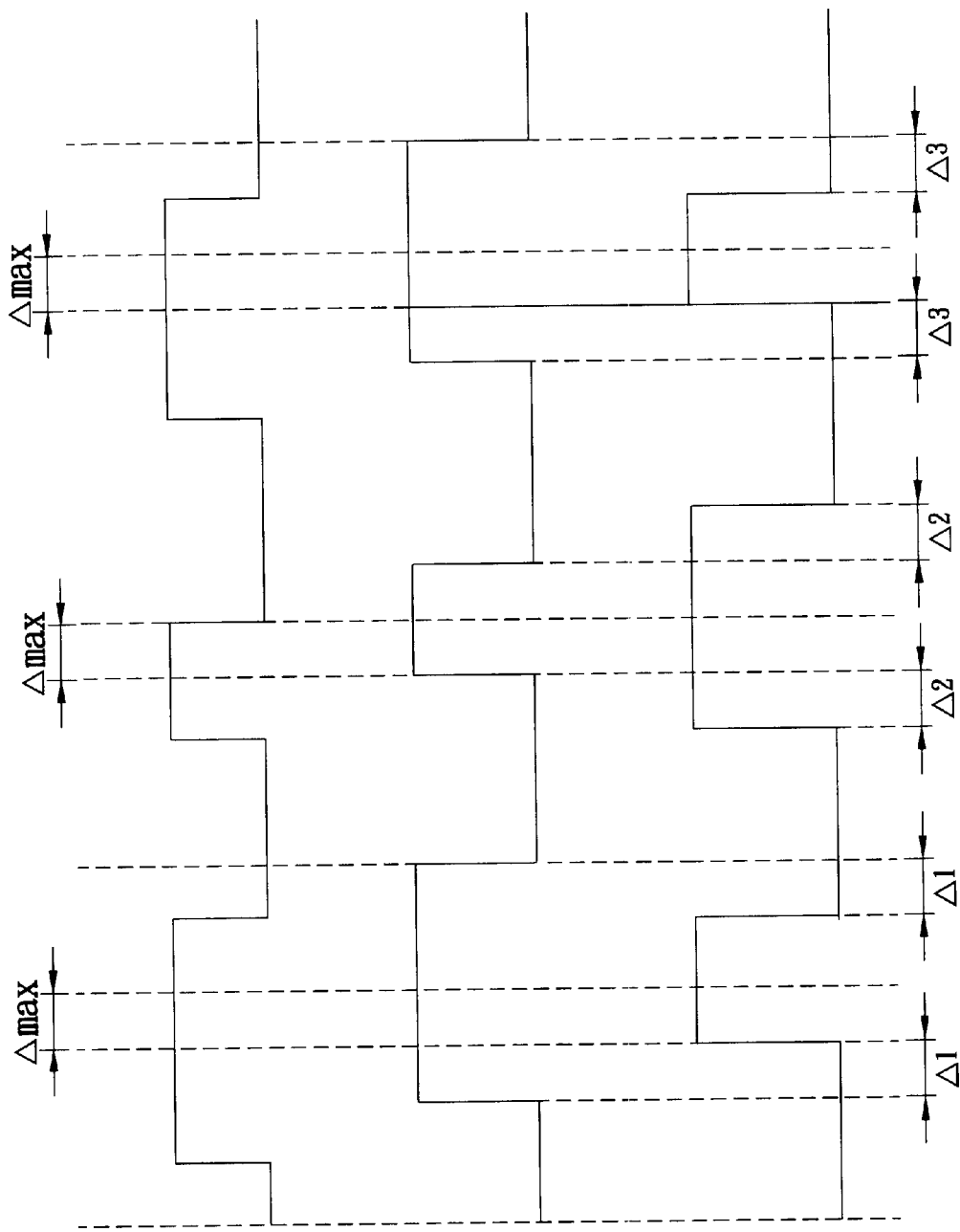
FIGS. 4(A), 4(B) and 4(C) are timing diagrams to illustrate the operation of a correction device of the model shown in FIG. 1.

Referring once again to FIG. 1, a phase shift device 11, a control signal generator 15 and a width-adjusting unit 16 cooperate to form a correction device of the power amplification system of this invention. FIGS. 4(A), 4(B) and 4(C) are timing diagrams to illustrate how the correction device operates to adjust the phase and width of each pulse of the input pulse-width modulated signal. Consecutive first, second and third pulses of the input pulse-width modulated signal are shown in FIG. 4(A). In FIG. 4(B), each of the pulses of the input pulse-width modulated signal of FIG. 4(A) is subjected to a phase shift such that the center of each pulse of the input pulse-width modulated signal forms a predetermined time difference ($\Delta$max) with the center of a corresponding pulse of the phase-shifted pulse-width modulated signal. The predetermined time difference ($\Delta$max) is chosen to be greater than one-half of a largest expected pulse width adjustment of each pulse of the input pulse-width modulated signal. In FIG. 4(C), the width of each pulse of the phase-shifted pulse-width modulated signal is corrected in accordance with the error signal from the processing unit 14 (see FIG. 1) by adjusting the leading and lagging edges thereof so as to result in a corrected pulse-width modulated signal that is provided to an input terminal of the power switching stage 10. Particularly, if the associated error signal has a negative value, the width of the corresponding pulse is widened by a corresponding amount, as illustrated by the second pulse of FIG. 4(C), and if the associated error signal has a positive value, the width of the corresponding pulse is narrowed by a corresponding amount, as illustrated by the first and third pulses of FIG. 4(C). With the phase and width of each pulse of the input pulse-width modulated signal adjusted in the manner described herein above, the phase noise introduced in the aforesaid conventional phase edge delay method can be eliminated, and the effect of internal system noise in the power amplification system of this invention can be minimized as well.

Referring once more to FIG. 1, the phase shift device 11 receives the low-frequency component (x), and introduces the required phase shift such that the predetermined time difference ($\Delta$max) is formed in the manner described beforehand.

Figure 5B:
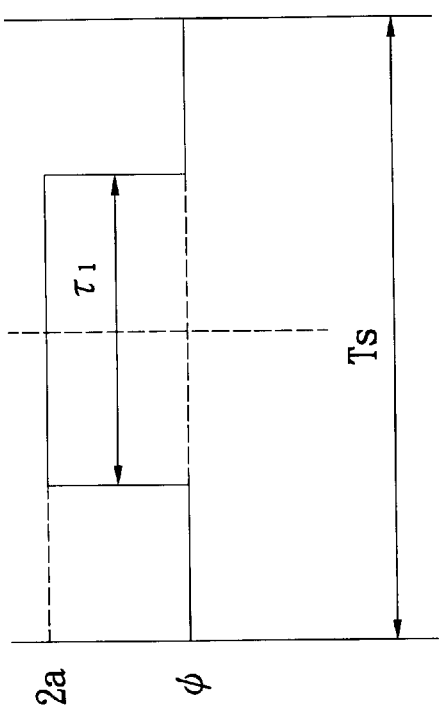
FIGS. 5(A), 5(B), 5(C) and 5(D) are timing diagrams to illustrate how Fourier transfer functions of scaling factors (Kc) for half-bridge and H-bridge power amplification systems based on the model of FIG. 1 are obtained.

In the power amplification system of FIG. 1, the error signal from the processing unit 14 is processed by the control signal generator 15 so as to generate a corresponding control signal. The control signal is subsequently received by the width-adjusting unit 16, thereby enabling the latter to adjust the width of each pulse of the phase-shifted pulse-width modulated signal from the phase shift device 11 so as to result in the corrected pulse-width modulated signal that is supplied to the input terminal of the power switching stage 10. Particularly, the control signal generator 15 scales the error signal by a predetermined scaling factor (Kc), the Fourier transfer function of which is obtained by dividing the difference between the corrected pulse-width modulated signal and the input pulse-width modulated signal by the error signal. FIGS. 5(A), 5(B), 5(C) and 5(D) illustrate how Fourier transfer functions of scaling factors (Kc) for half-bridge and H-bridge power amplification systems based on the model of FIG. 1 are obtained. In FIG. 5(A), it is assumed that a single error signal is sampled by the processing unit 14 per second. In FIG. 5(B), assuming that only low-frequency components are considered, the Fourier transform of the signal of FIG. 5(A) is the same as that of the signal shown in FIG. 5(B). The relevant equation is as follows:

$$[a \cdot e^{j\theta_1} + a \cdot e^{-j\theta_1}]\tau_1 \cdot [\sin(\pi f\tau_1)/\pi f_{96\ 1}] = (2a)\tau_1 \cdot [\sin(\rho f\tau_1)/\pi f\tau_1] \quad (1)$$

Figure 5C:
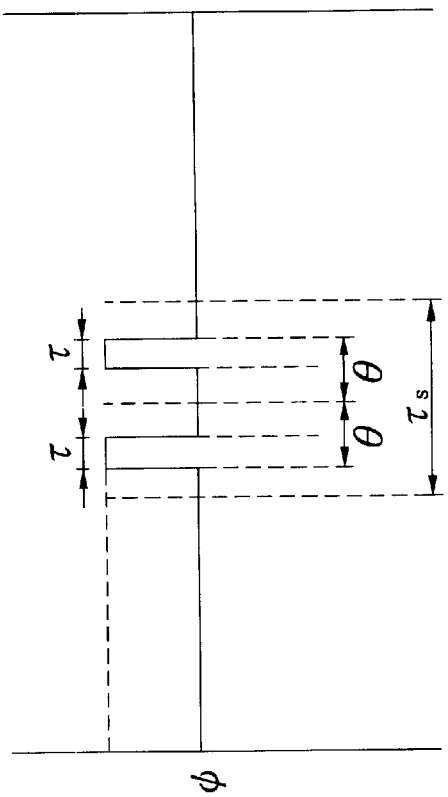
Figure 5A:
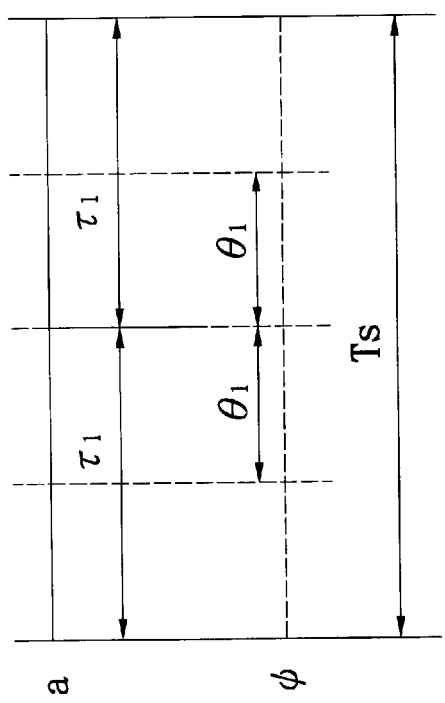

FIG. 5(C) illustrates the difference between the corrected pulse-width modulated signal and the input pulse-width modulated signal for a half-bridge power amplification system based on the model of FIG. 1. The Fourier transform thereof is as follows:

$$2C \cdot \tau [\sin(\pi f\tau)/\pi f\tau] \quad (2)$$

As such, based on (1) and (2), the scaling factor (Kc) for a half-bridge power amplification system based on the model of FIG. 1 is as follows:

$$Kc = 2C \cdot \tau [\sin(\pi f\tau)/\pi f\tau]/(2a)\tau_1 \cdot [\sin(\pi f\tau_1)/\pi f\tau_1] \quad (3)$$

Figure 5D:
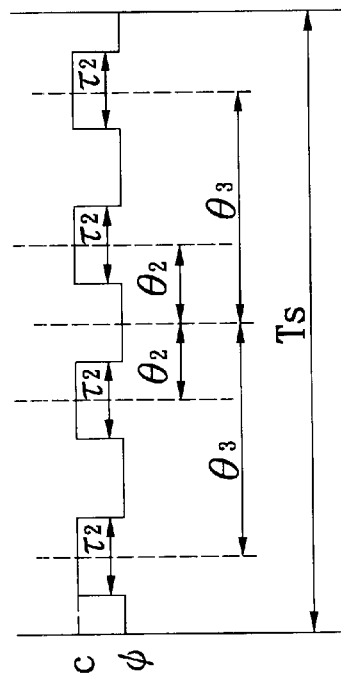

FIG. 5(D) illustrates the difference between the corrected pulse-width modulated signal and the input pulse-width modulated signal for an H-bridge power amplification system based on the model of FIG. 1. The Fourier transform thereof is as follows:

$$4C \cdot \tau_2 [\sin(\pi f\tau_2)/\pi f\tau_2] \quad (4)$$

As such, based on (1) and (4), the scaling factor (Kc) for an H-bridge power amplification system based on the model of FIG. 1 is as follows:

$$Kc = 4C \cdot \tau_2 [\sin(\pi f\tau_2)/\pi f\tau_2/(2a)\tau_1 \cdot [\sin(\tau f\tau_1)/\pi f\tau_1] \quad (5)$$

From Equations (3) and (5), it is evident that the scaling factor (Kc) can be considered to be a constant when the frequency (f) is relatively low.

The values of the scaling factor (Kc) and the scale-down factor (K) are chosen according to the signal transfer function (STF) and the noise transfer function (NTF) of the power amplification system. When the STF value is high, the magnitude of the amplified output signal (y) is increased accordingly. When the NTF value is low, the noise inhibiting capability of the power amplification system is enhanced accordingly.

The amplified output signal (y) of the power amplification system of FIG. 1 can be represented by the following equation:

$$y = Kpxe^{-jw\Delta max} + \{H(w)Kcxe^{-jw\Delta max} - [yH(w)Kce^{-jw\Delta max}/K]\}Kp + N \quad (6)$$

The STF of the power amplification system of FIG. 1 is:

$$STF = [Kp + H(w)KcKp]e^{-jw\Delta max}/[1 + H(w)Kce^{-jw\Delta max}Kp/K] \quad (7)$$

The NTF of the power amplification system of FIG. 1 is:

$$NTF = 1/[1 + H(w)Kce^{-jw\Delta max}Kp/K] \quad (8)$$

From Equation (7), it is apparent that when the scale-down factor (K) is increased, the STF value will correspondingly increase. However, from Equation (8), an increase in the value of the scale-down factor (K) will lead to a corresponding increase in the NTF value. The scaling factor (Kc) is thus used to control the undesired increase in the NTF value when the scale-down factor (K) is increased.

Figure 6:
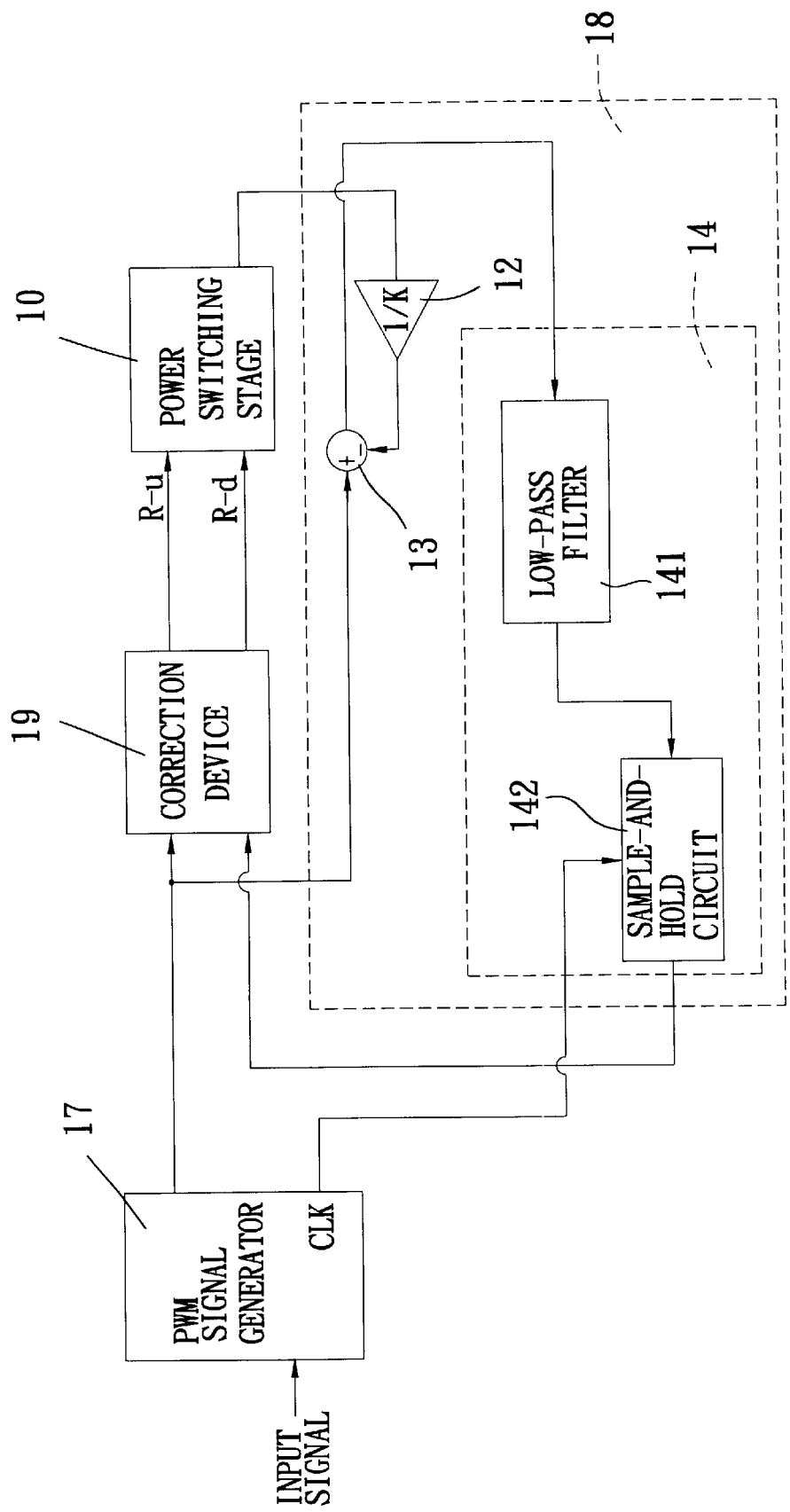
FIG. 6 is a block diagram illustrating a half-bridge type power amplification system based on the model of FIG. 1.

FIG. 6 is a block diagram illustrating a low-distortion half-bridge type power amplification system based on the model of FIG. 1. The power amplification system of FIG. 6 comprises a PWM signal generator 17, a power switching stage 10, an error signal generator 18, and a correction device 19.

The PWM signal generator 17 is conventional in construction and is of the type commonly found in half-bridge power amplification systems. The PWM signal generator 17 is adapted to convert an input signal, which may be an analog or digital signal, into the input pulse-width modulated signal.

The power switching stage 10 is conventional in construction and is of the type commonly found in half-bridge type power amplification systems.

The error signal generator 18 includes: a feedback signal generator in the form of a scale-down unit 12 and connected to the output terminal of the power switching stage 10 so as to receive the amplified output signal therefrom; a comparator 13, in the form of a subtractor, that compares the feedback signal from the scale-down unit 12 with the input pulse-width modulated signal; and a processing unit 14, similar to that shown in FIG. 2. Sample-and-hold circuit 142 of the processing unit 14 receives a clock input (CLK) from the PWM signal generator 17. Since the operation of the error signal generator 18 has been detailed hereinbefore, a description of the same will be dispensed with herein for the sake of brevity.

Figure 7:
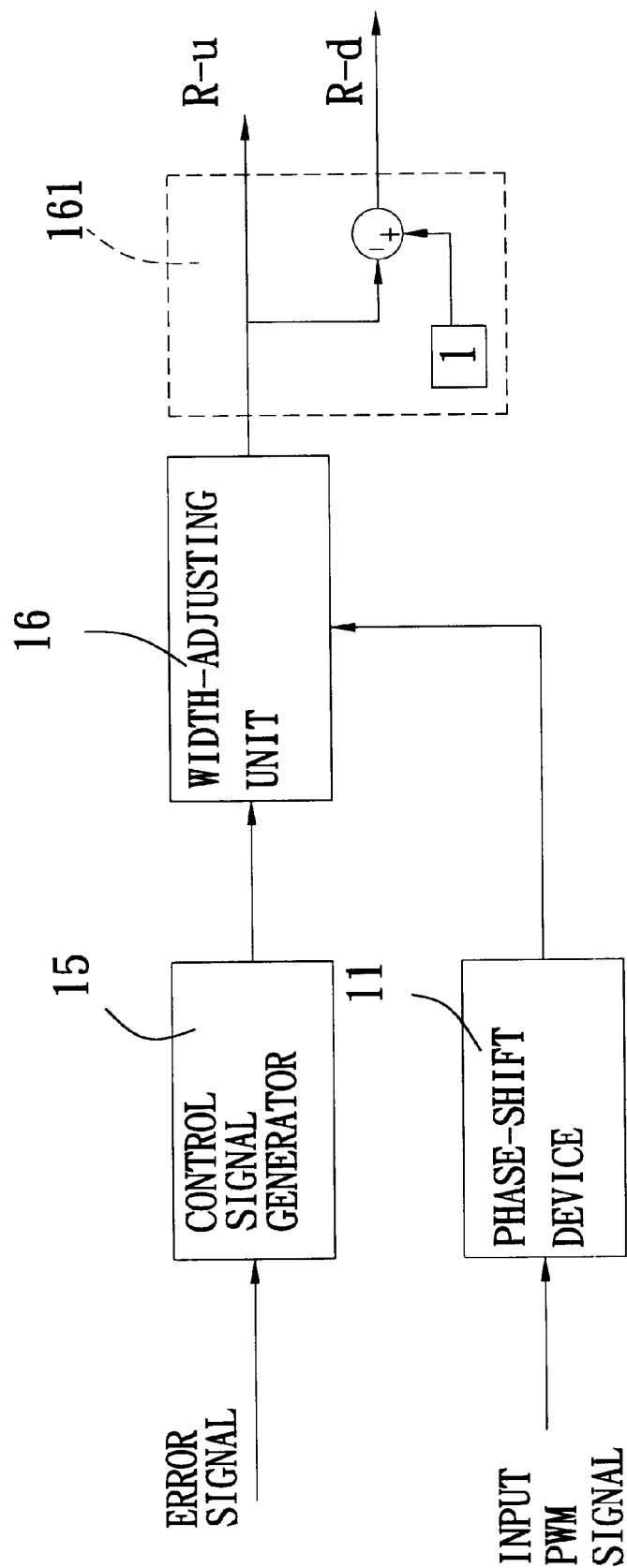
FIG. 7 is a block diagram illustrating a correction device for the power amplification system of FIG. 6.

The correction device 19 receives the input pulse-width modulated signal from the PWM signal generator 17 and the error signal from the error signal generator 18. FIG. 7 illustrates the correction device 19 for the power amplification system of FIG. 6. As shown, the correction device 19 includes a phase shift device 11 for generating the phase-shifted pulse-width modulated signal from the input pulse-width modulated signal, a control signal generator 15 for processing the error signal from the error signal generator 18 (see FIG. 6) so as to generate a corresponding control signal, and a width-adjusting unit 16 for adjusting the width of each pulse of the phase-shifted pulse-width modulated signal from the phase shift device 11 in accordance with the control signal from the control signal generator 15. Since the operation of the correction device 19 has been detailed hereinbefore, a description of the same will be dispensed with herein for the sake of brevity.

As is known in the art, the power switching stage 10 of half-bridge type power amplification systems requires two channel input signals, namely R_u and R_d channel input signals. In order to enable the correction device 19 to generate the two channel input signals, a channel signal generator 161 is disposed between the width-adjusting unit 16 and the power switching stage 10. As shown in FIG. 7, the output of the width-adjusting unit 16 serves the R_u channel input signal. The R_d channel input signal is then generated by the channel signal generator 161 by subtracting the output of the width-adjusting unit 16 from a constant value of 1.

Figure 8:
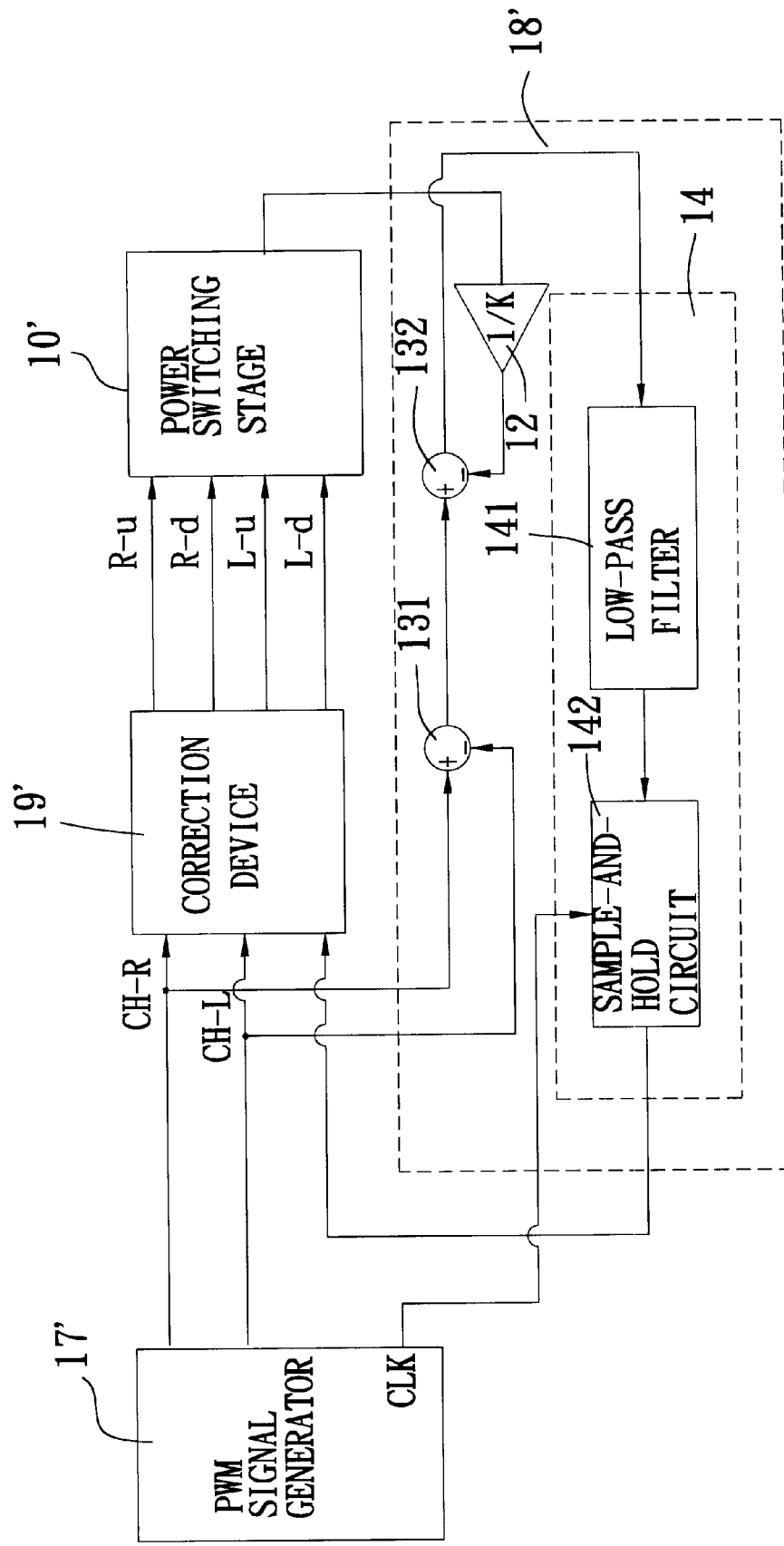
FIG. 8 is a block diagram illustrating an H-bridge type power amplification system based on the model of FIG. 1.

FIG. 8 is a block diagram illustrating a low-distortion H-bridge type power amplification system based on the model of FIG. 1. The power amplification system of FIG. 8 comprises a PWM signal generator 17', a power switching stage 10', an error signal generator 18', and a correction device 19'.

The PWM signal generator 17' is conventional in construction and is of the type commonly found in H-bridge power amplification systems. The PWM signal generator 17' is adapted to convert an input signal, which may be an analog or digital signal, into the input pulse-width modulated signal that includes CH_R and CH_L channel signals, which may be generated in the following known manner: An input signal, such as a pulse-coded modulation (PCM) signal is processed to form a +PCM channel signal and a −PCM channel signal, i.e. the +PCM channel signal multiplied by a factor of −1. Each of the +PCM and −PCM channel signals then undergoes comparison and modulation processing with the use of a sawtooth waveform to thereby obtain the CH_R and CH_L channel signals, respectively.

The power switching stage 10' is conventional in construction and is of the type commonly found in H-bridge type power amplification systems.

Unlike the error signal generator 18 shown in FIG. 6, the error signal generator 18' of the power amplification system of FIG. 8 includes a first subtractor 131 that receives the CH_R and CH_L channel signals from the PWM signal generator 17', and that obtains a first difference therebetween. A second subtractor 132 receives the first difference and the feedback signal from the scale-down unit 12, and obtains a second difference there between. The second difference is then processed by the processing unit 14 to result in the required error signal that is provided to the correction device 19'.

The correction device 19' in the power amplification system of FIG. 8 includes two identical sets of the circuit shown in FIG. 7. The circuits process a respective one of the CH_R and CH_L channel signals from the PWM signal generator 17' but with opposing polarities of the error signal from the error signal generator 18' to result in the required R_u, R_d, L_u and L_d channel input signals which are provided to the power switching stage 10'.

In the correction devices of the power amplification systems of FIGS. 6 and 8, pulse width adjustment is performed after phase adjustment. However, it is also possible to perform pulse width adjustment before phase adjustment or to perform pulse width adjustment simultaneous with phase adjustment to arrive at the same result.

In practice, the correction device can be implemented using a ramp generator. The ramp generator generates a ramp output upon detection of each leading and lagging edge of each pulse of the input pulse width-modulated signal. The ramp output has an intermediate point corresponding to a phase shift (Δmax) that is selected when the error signal is 0. When correcting the leading edge of each pulse of the input pulse-width modulated signal, the lower part of the ramp output is selected if the error signal is negative, whereas the upper part of the ramp output is selected if the error signal is positive. When correcting the lagging edge of each pulse of the input pulse-width modulated signal, the lower part of the ramp output is selected if the error signal is positive, whereas the upper part of the ramp output is selected if the error signal is negative. With the leading and lagging edges of the pulses of the input pulse-width modulated signal adjusted in the aforesaid manner, aside from introducing the requiredphase shift, the pulses of the input pulse-width modulated signal are widened or narrowed in accordance with the magnitude and polarity of the error signal. However, stability of the ramp output is easily influenced by the ambient temperature condition. Unstable operation of the ramp generator can thus lead to severe distortion. As such, the correction device of the power amplification system of this invention preferably incorporates a temperature compensation circuit in order to overcome this drawback. The temperature compensation circuit monitors a temperature-dependent drift in the slope of the ramp output. By implementing the control signal generator as a variable gain amplifier, the scaling factor (Kc) can be adjusted according to the detected temperature-dependent drift to minimize the effect of distortion due to unstable operation of the ramp generator.

Figure 9:
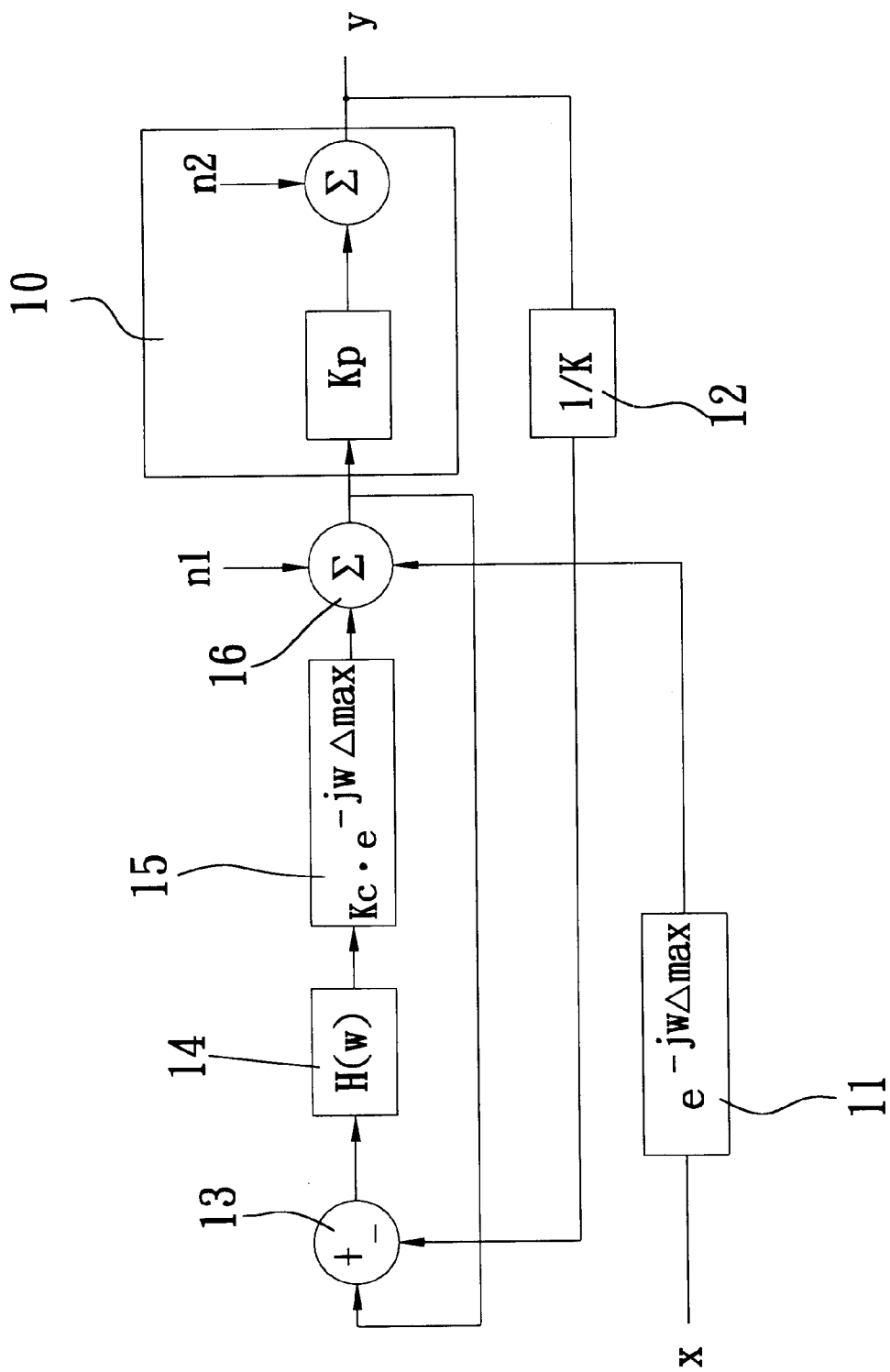
FIG. 9 illustrates a low-frequency model of the second preferred embodiment of a low-distortion power amplification system according to the present invention.

FIG. 9 illustrates a low-frequency model of the second preferred embodiment of a low-distortion power amplification system according to the present invention. Unlike the model of FIG. 1, the comparator 13 compares the amplified output signal (y) with the corrected pulse-width modulated signal that is supplied to the input terminal of the power switching stage 10.

The amplified output signal (y) of the power amplification system of FIG. 9 can be represented by the following equation:

$$y = n2\mu Kp$$

wherein $$\mu n1 + xe^{-jw\Delta max} + [\mu - y/K]H(w)Kce^{jw\Delta max}$$

The STF of the power amplification system of FIG. 9 is:

$$STF = Kp/[1 - H(w)Kce^{-jw\Delta max} + KpH(w)Kce^{-jw\Delta max}/K]$$

$N_2TF$, which is the noise transfer function for noise internally of the power switching stage 10, is:

$$N_2TF = 1 - -H(w)Kce^{-jw\Delta max}]/[1 - H(w)Kce^{jw\Delta max} + KpH(w)Kce^{jw\Delta max}/K]$$

$N_1TF$, which is the noise transfer function for noise externally of the power switching stage 10, is:

$$N_1TF = Kp/[1 - H(w)Kce^{-jw\Delta max} + KpH(w)Kce^{-jw\Delta max}/K]$$

The definitions of K, Kc and Kp are similar to those described in connection with the model of FIG. 1.

Figure 10:
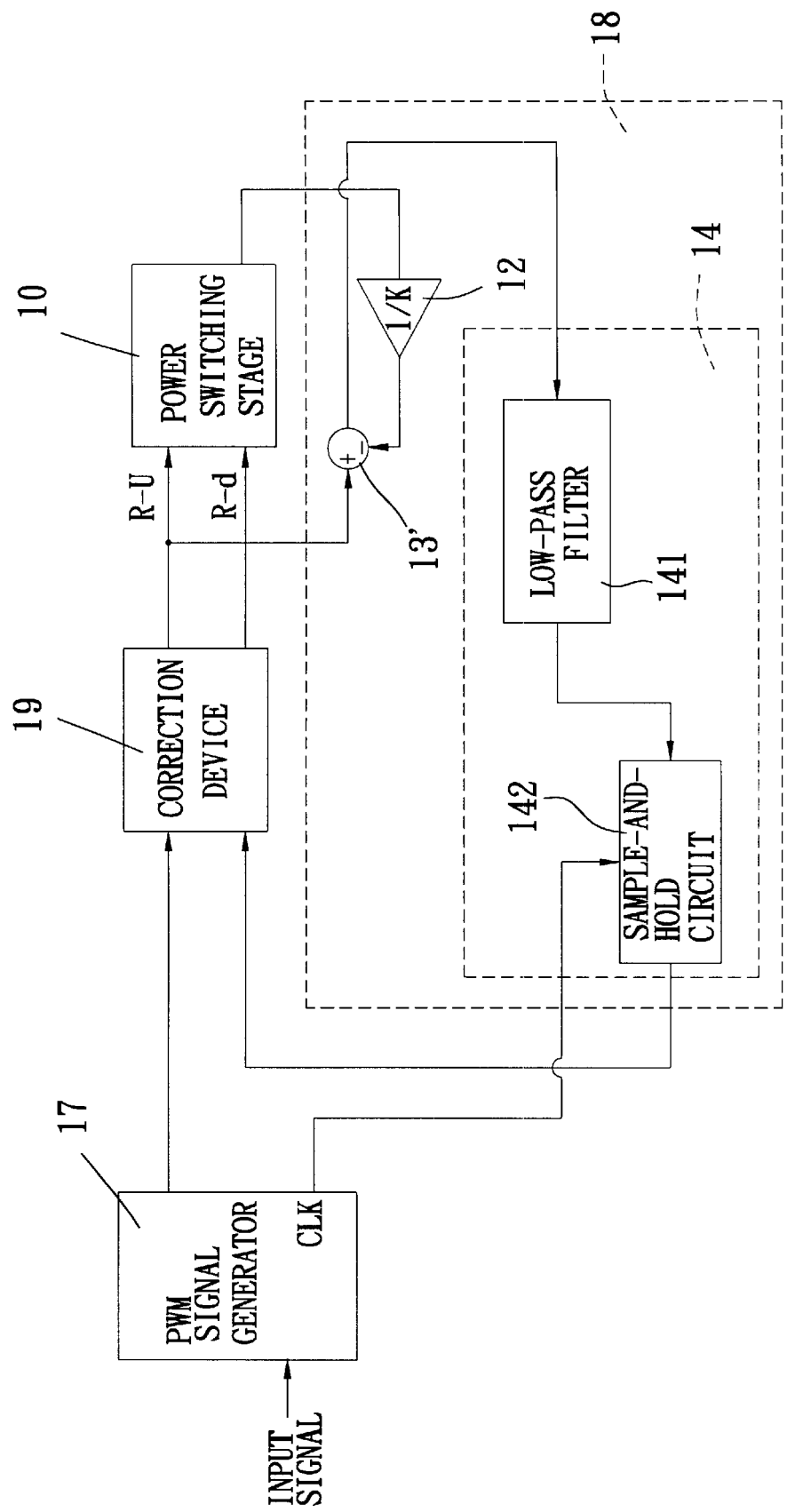
FIG. 10 is a block diagram illustrating a half-bridge type power amplification system based on the model of FIG. 9.

FIG. 10 is a block diagram illustrating a half-bridge type power amplification system based on the model of FIG. 9. Unlike the system shown in FIG. 6, the comparator 13' of the error signal generator 18 compares the R__u channel input signal (or the R__d channel input signal) with the feedback signal from the scale-down unit 12.

Figure 11:
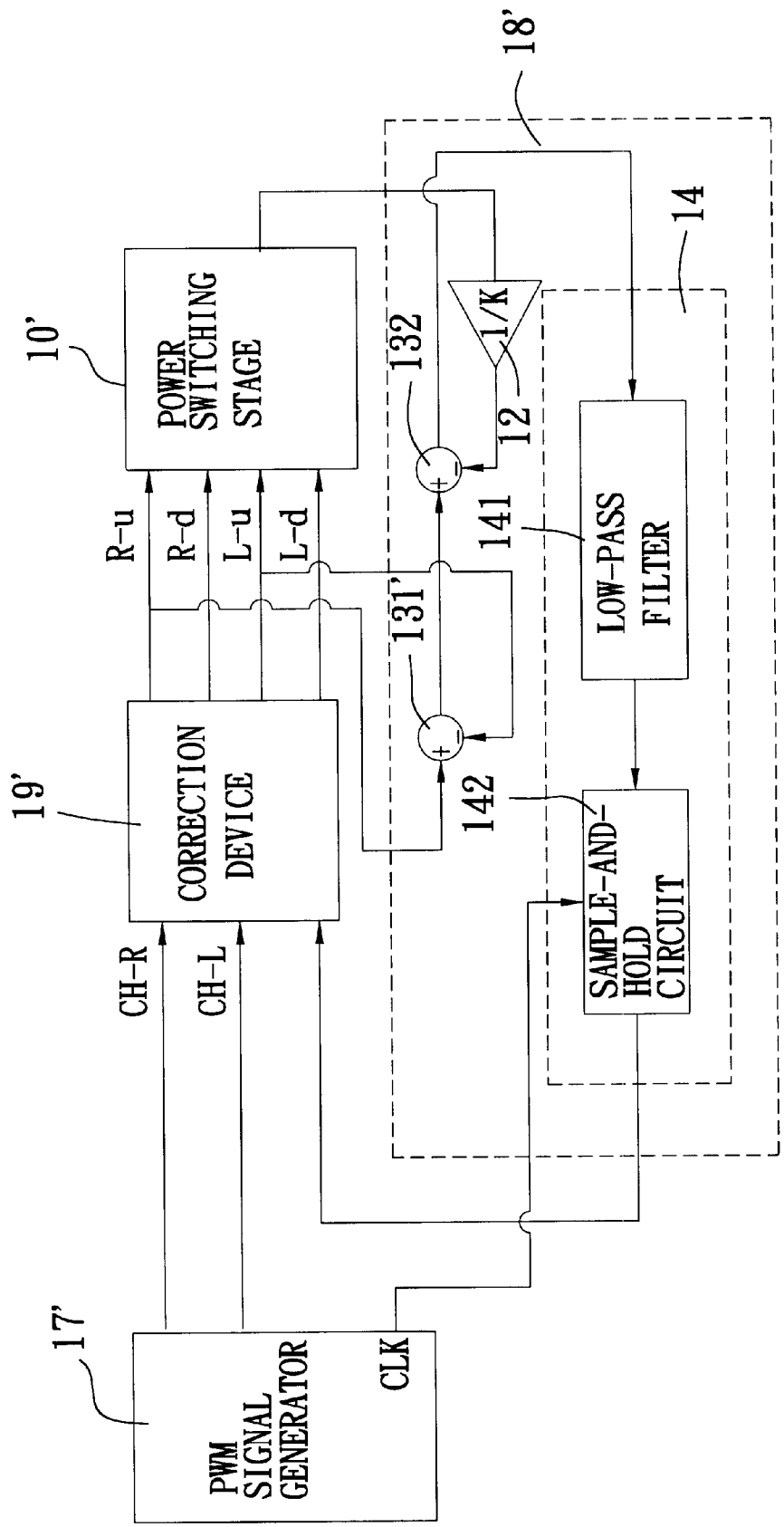
FIG. 11 is a block diagram illustrating an H-bridge type power amplification system based on the model of FIG. 9.
Figures 13A, 13B, 13C, 13D:
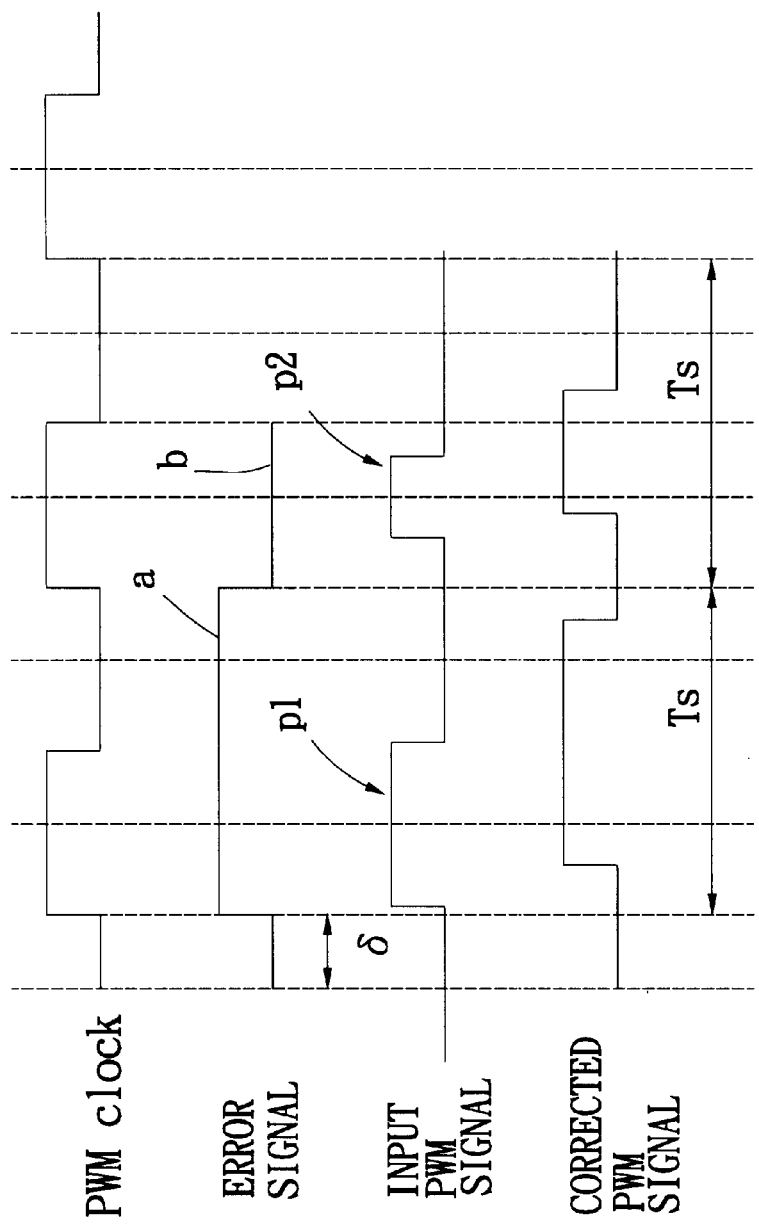
FIGS. 13(A) to 13(D) are timing diagrams which illustrate how accurate operation of the power amplification signal can be ensured by introducing an appropriate delay to the clock of the signal generator.

FIG. 11 is a block diagram illustrating an H-bridge type power amplification system based on the model of FIG. 9. Unlike the system shown in FIG. 8, the first subtractor 131' obtains the difference between the R__u and L__u (or R__d and L__d) channel input signals.

With reference to FIGS. 12(A) to 12(D), when the error signal is synchronized with the PWM clock from the PWM signal generator, assuming that a first pulse (a) of the error signal is used to control a first pulse (p1) of the input pulse-width modulated signal, it is possible that the width of the corresponding pulse in the corrected pulse-width modulated signal will extend to the period of a second pulse (b) of the error signal. The latter part of the first pulse (p1) will thus be inaccurately subjected to adjustment in accordance with the second pulse (b) of the error signal. Referring to FIGS. 13(A) to 13(D), in order to solve the aforesaid problem, an appropriate delay (δ) is preferably introduced into the PWM clock such that the error signal is correspondingly delayed. The delay (δ) is chosen to be not greater than one-half of the modulation index of the input pulse-width modulated signal. For example, if the modulation index for the first pulse (p1) is 0.5, the delay (δ) should not be greater than 0.25. The introduction of the delay (δ) in the PWM clock can ensure that the pulses of the corrected pulse-width modulated signal will be properly controlled by the pulses of the error signal.

While the present invention has been described in connection with what is considered the most practical and preferred embodiments, it is understood that this invention is not limited to the disclosed embodiments but is intended to cover various arrangements included within the spirit and scope of the broadest interpretation seas to encompass all such modifications and equivalent arrangements.

I claim:

1. A method for low-distortion power amplification, comprising the steps of:

generating an error signal by comparing a feedback signal obtained from an amplified output signal at an output terminal of a power switching stage with one of an inputpulse-width modulated signal from a pulse-width modulation signal generator and a corrected pulse-width modulated signal at an input terminal of the power switching stage; and correcting each pulse of the input pulse-width modulated signal from the pulse-width modulation signal generator to result in the corrected pulse-width modulated signal that is provided to the input terminal of the power switching stage, said each pulse of the input pulse-width modulated signal being corrected by adjusting the phase thereof such that said each pulse of the input pulse-width modulated signal has a center that forms a predetermined time difference with a center of a corresponding pulse of the corrected pulse-width modulated signal, and by adjusting the width thereof according to the error signal.

2. The method of claim 1, wherein the predetermined time difference is greater than one-half of a largest expected pulse width adjustment of said each pulse of the input pulse-width modulated signal.

3. A system for low-distortion power amplification, comprising:

a pulse-width modulation signal generator for generating an input pulse-width modulated signal;

a power switching stage having an input terminal to receive a corrected pulse-width modulated signal, and an output terminal from which an amplified output signal is obtained;

an error signal generator including
  a feedback signal generator connected to said output terminal of said power switching stage and operable so as to generate a feedback signal from the amplified output signal at said output terminal of said power switching stage,
  a comparator connected to said feedback signal generator and one of said pulse-width modulation signal generator and said input terminal of said power switching stage, said comparator comparing the feedback signal with one of the input pulse-width modulated signal and the corrected pulse-width modulated signal to result in a difference signal, and
  a processing unit connected to said comparator for processing the difference signal to remove high frequency components therefrom so as to result in an error signal; and a correction device connected to said pulse-width modulation signal generator, said processing unit and said input terminal of said power switching stage, said correction device correcting each pulse of the input pulse-width modulated signal from said pulse-width modulation signal generator to result in the corrected pulse-width modulated signal that is provided to said input terminal of said power switching stage, said correction device correcting said each pulse of the input pulse-width modulated signal by adjusting the phase thereof such that said each pulse of the input pulse-width modulated signal has a center that forms a predetermined time difference with a center of a corresponding pulse of the corrected pulse-width modulated signal, and by adjusting the width thereof according to the error signal from said processing unit.

4. The system of claim 3, wherein the predetermined time difference is greater than one-half of a largest expected pulse width adjustment of said each pulse of the input pulse-width modulated signal.

5. The system of claim 3, wherein said feedback signal generator is a scale-down unit for scaling down the amplified output signal to result in the feedback signal.

6. The system of claim 3, wherein said processing unit includes:
- a low pass filter connected to said feedback signal generator; and
- a sample-and-hold circuit connected to said low pass filter and said correction device.

7. The system of claim 3, wherein said processing unit includes:
- a low pass filter connected to said feedback signal generator;
- an over-sampling circuit connected to said low pass filter; and
- a decimator connected to said over-sampling circuit and said correction device.

* * * * *